US011249049B2

(12) United States Patent
Cole et al.

(10) Patent No.: US 11,249,049 B2
(45) Date of Patent: Feb. 15, 2022

(54) BULK ACOUSTIC WAVE RESONATOR BASED SENSOR

(71) Applicant: The University of Warwick, Coventry (GB)

(72) Inventors: Marina Cole, Coventry (GB); Julian Gardner, Coventry (GB); Farah Villa Lopez, Coventry (GB); Sanju Thomas, Coventry (GB)

(73) Assignee: The University of Warwick, Warwickshire (GB)

( * ) Notice: Subject to any disclaimer, the term of this patent is extended or adjusted under 35 U.S.C. 154(b) by 189 days.

(21) Appl. No.: 16/336,197

(22) PCT Filed: Sep. 25, 2017

(86) PCT No.: PCT/GB2017/052866
§ 371 (c)(1),
(2) Date: Mar. 25, 2019

(87) PCT Pub. No.: WO2018/055414
PCT Pub. Date: Mar. 29, 2018

(65) Prior Publication Data
US 2019/0212300 A1  Jul. 11, 2019

(30) Foreign Application Priority Data

Sep. 26, 2016  (GB) ..................... 1616271

(51) Int. Cl.
*G01N 29/02* (2006.01)
*G01N 29/036* (2006.01)
*H03H 9/17* (2006.01)

(52) U.S. Cl.
CPC ........ *G01N 29/022* (2013.01); *G01N 29/036* (2013.01); *G01N 2291/0426* (2013.01); *H03H 9/175* (2013.01)

(58) Field of Classification Search
CPC ............... G01N 29/022; G01N 29/036; G01N 2291/0426; H03H 9/175; H01L 41/00; H01L 41/1132
See application file for complete search history.

(56) References Cited

U.S. PATENT DOCUMENTS

2007/0052327 A1\* 3/2007 Vilander ............ H03H 9/02834
310/343
2008/0298427 A1\* 12/2008 Gabl .................... G01N 29/036
374/119

(Continued)

FOREIGN PATENT DOCUMENTS

CN     101630946     1/2010
EP     1959568 A1    8/2008

(Continued)

OTHER PUBLICATIONS

WIPO; International Preliminary Report on Patentability for International Application No. PCT/GB2017/052866 dated Apr. 4, 2019, 8 pages.

(Continued)

*Primary Examiner* — David Z Huang
(74) *Attorney, Agent, or Firm* — NK Patent Law

(57) ABSTRACT

An integrated circuit is disclosed. The integrated circuit comprises a silicon substrate, a sensor comprising a bulk acoustic wave resonator and an acoustic mirror disposed between the bulk acoustic wave resonator and the substrate, and a CMOS circuit supported by substrate and operatively connected to the sensor.

17 Claims, 6 Drawing Sheets

(56) References Cited

U.S. PATENT DOCUMENTS

| | | | | |
|---|---|---|---|---|
| 2011/0187227 A1* | 8/2011 | Chen | ............ | H03H 9/02007 |
| | | | | 310/318 |
| 2012/0098611 A1 | 4/2012 | Sinha et al. | | |
| 2012/0164753 A1* | 6/2012 | Johnston | ............ | G01N 29/036 |
| | | | | 436/501 |
| 2014/0225682 A1* | 8/2014 | Burak | ............ | H03H 9/02118 |
| | | | | 333/187 |

FOREIGN PATENT DOCUMENTS

| | | |
|---|---|---|
| WO | 9816957 A1 | 4/1998 |
| WO | 2010127122 A1 | 11/2010 |

OTHER PUBLICATIONS

UKIPO, Combined Search and Examination Report for UK Patent Application No. 1616271.1, dated Jan. 19, 2017, 9 pages.

Augustyniak, M. et al.: "An integrated gravimetric FBAR circuit for operation in liquids using a flip-chip extended 0.13[mu]m CMOS technology", 2007 IEEE International Solid-State Circuits Conference, Feb. 11-15, 2007, pp. 392, 393, and 610, ISBN 1-4244-0852-0, USA.

Thomas, S. et al.: "Particle Sensor Using Solidly Mounted Resonators", IEEE Sensors Journal, Apr. 15, 2016, vol. 16, No. 8, pp. 2282-2289, ISSN 1530-437X (print), USA.

ISA/EP, International Search Report and Written Opinion for PCT Patent Application No. PCT/GB2017/052866, dated Dec. 20, 2017.

Johnston, M. L. et al.: "Integrated VOC vapor sensing on FBAR-CMOS array", Micro Electro Mechanical Systems (MEMS), 2012 IEEE 25th International Conference On, IEEE, Jan. 29, 2012, pp. 846-849, XP032137379, ISBN: 978-1-4673-0324-8.

Villa-López, F. H. et al.: "Design and modelling of solidly mounted resonators for low-cost particle sensing", Meas. Sci. Technol. 27 (2016) 025101, 13 pages.

Villa-López, F. H.: "Design and modelling—CMOS-based SMR modelling—XFAB process heater + SMR", University of Warwick, Design and Modelling. CMOS-based SMR—XFAB process, Dec. 2015, 7 pages.

\* cited by examiner

BULK ACOUSTIC WAVE RESONATOR BASED SENSOR

CROSS REFERENCE TO RELATED APPLICATIONS

This application is a U.S. National Stage application of PCT Patent Application No. PCT/GB2017/052866 filed on Sep. 25, 2017, which claims priority to United Kingdom Patent Application No. 1616271.1 filed on Sep. 26, 2016, the entire content of all of which is incorporated by reference herein.

FIELD OF THE INVENTION

The present invention relates to a bulk acoustic wave resonator based sensor.

BACKGROUND

Bulk acoustic wave (BAW) devices can be used to sense micrometre- and sub-micrometre-sized airborne particles. A BAW device contains a resonator which includes a thin layer of piezoelectric material sandwiched between two electrodes. The two electrodes are used to apply an alternating electric field to the piezoelectric layer and generate a mechanical wave in the resonator. The resonator exhibits a resonant frequency which depends on, among other things, mass load. When particles land on the resonator, the mass load changes, thereby causing a shift in resonant frequency which can be detected by a frequency-sensitive circuit.

In a thin-film bulk acoustic wave resonator (FBAR), a resonator is fabricated on top a substrate and is acoustically isolated from the substrate by suspending the resonator across an air gap which may be formed, for example, by etching the reverse side of the substrate under the resonator.

In a solidly mounted resonator (SMR), a resonator is supported on a Bragg reflector (or "acoustic mirror") comprising a stack of high and low acoustic impedance materials which may be, for example, alternating metal and dielectric layers.

An example of an SMR particle sensor is described in S. Thomas et al.: "Particle Sensor Using Solidly Mounted Resonators", IEEE Sensors Journal, volume 16, number 8, pages 2282 to 2289 (2016) which is incorporated herein by reference. Reference is also made WO 98/16957 A1.

SUMMARY

According to a first aspect of the present invention there is provided an integrated circuit or integrated device comprising a silicon substrate, a sensor comprising a bulk acoustic wave resonator and an acoustic mirror disposed between the bulk acoustic wave resonator and the substrate, and a CMOS circuit supported by substrate and operatively connected to the sensor.

The integrated circuit or integrated device may comprise CMOS process-defined layers, wherein the CMOS process-defined layers include the acoustic mirror.

The integrated circuit or integrated device may further comprise a heater disposed between the acoustic mirror and the substrate. The heater may be used for temperature control. The heater may be used to modulate temperature of the sensor. This can be used to enhance performance of the sensor by, for example, improving sensitivity and/or helping to provide selectivity when detecting volatile organic compounds (VOC). The integrated circuit or integrated device may be used for sensing or detecting gas, particle(s), analyte or other target.

A heater element (for example a loop or coil of conducting material) may lie within or substantially within a peripheral edge of the mirror. The heater element may lie within or substantially within a peripheral edge of the resonator. The integrated circuit or integrated device may further comprise a heat-spreading plate disposed under or over the heater.

The heater may comprise a loop or coil of conductive material, e.g. a metal or metal alloy, or a semiconductor.

The integrated circuit or integrated device may further comprise a temperature sensor disposed between the acoustic mirror and the substrate.

The integrated circuit or integrated device may further comprise a reference sensor comprising a bulk acoustic wave resonator; and an acoustic mirror disposed between the bulk acoustic wave resonator and the substrate.

The silicon substrate may include a hole through the substrate so as to cause the sensor to be suspended over the hole.

The integrated circuit or integrated device may be a sensor, such as a gas or/or particle sensor.

According to a second aspect of the present invention there is provided a system comprising the integrated circuit or device according to the first aspect of the present invention and a controller operatively connected to integrated circuit or device configured to receive signals from integrated circuit and/or to provide control signals to the integrated circuit.

According to a third aspect of the present invention there is provided a method of operating a device or an integrated circuit according to the first aspect of the present invention. The method comprises the CMOS circuit driving the sensor and measuring signals from the sensor.

The integrated circuit or integrated device may comprise a heater and the method may further comprises modulating current through the heater so as to modulate temperature of the sensor.

BRIEF DESCRIPTION OF THE DRAWINGS

Certain embodiments of the present invention will now be described, by way of example, with reference to the accompanying drawings, in which.

DETAILED DESCRIPTION OF CERTAIN EMBODIMENTS

BAW Resonator Based Sensing System 1

Figure 1:
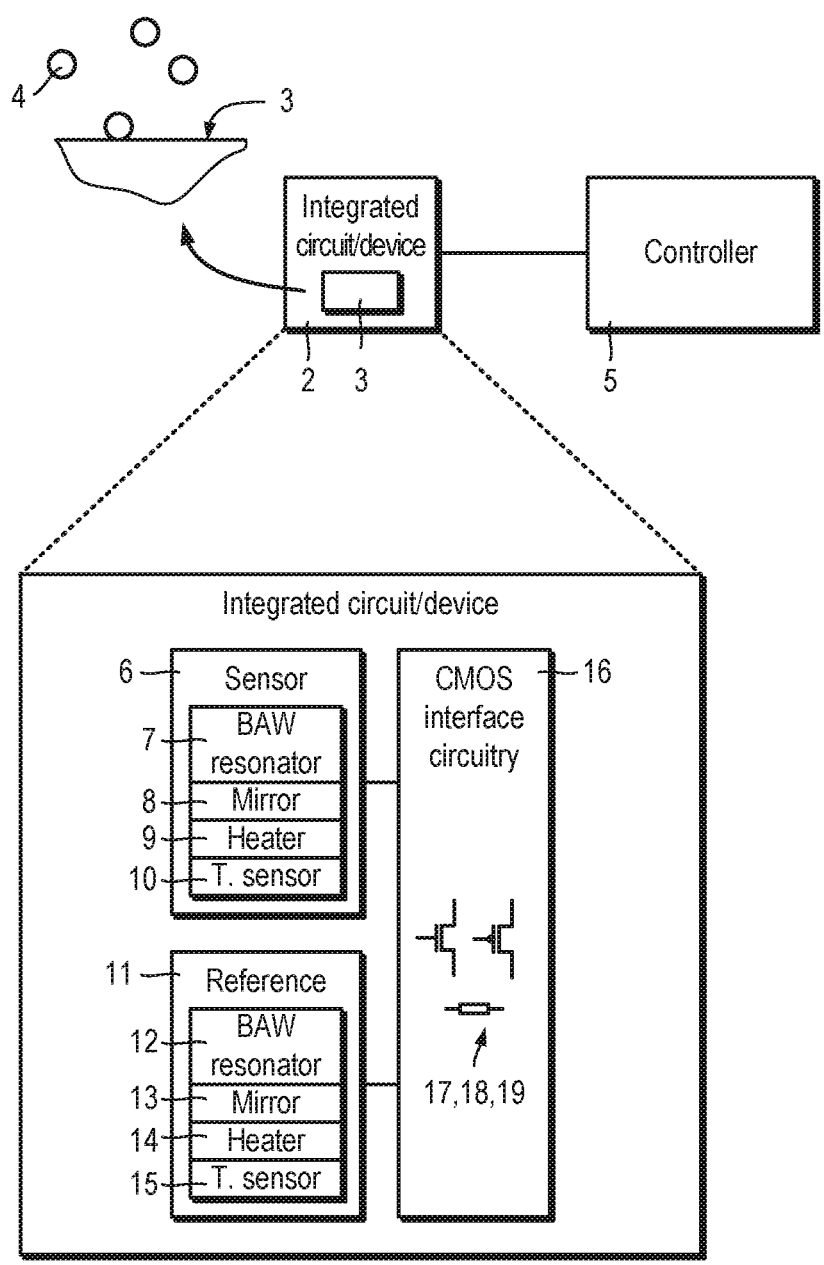
FIG. 1 is a schematic block diagram of a bulk acoustic wave resonator based sensing system which comprises an integrated circuit comprising a sensor which includes a heater, a temperature sensor, an acoustic mirror and a bulk acoustic wave resonator, and interface circuitry, and a controller.

Referring to FIG. 1, a bulk acoustic wave (BAW) resonator based sensing system 1 (herein referred to simply as a "sensing system") is shown. The sensing system 1 can be used to sense or detect micrometre- and sub-micrometre-sized airborne particles, particularly particles having a diameter equal to or less than 10 μm and particles having a diameter equal to or less than 2.5 μm, ultra-fine particles, volatile organic compounds, biological samples and/or liquids.

The sensing system 1 comprises an integrated circuit or integrated device 2 (or "integrated device"), which serves as a sensor chip and which includes a surface 3 for sensing an analyte 4 (such as micrometre-sized airborne particles), and a controller 5. The sensing-surface 3 may be coated with a suitable receptor (not shown) for binding to specific analytes.

The integrated circuit 2 comprises a sensor 6 which includes a BAW resonator 7 which is supported on an acoustic mirror 8 and which is provided with a heater 9 and a temperature sensor 10. The integrated circuit 2 also includes a reference device 11 comprising a corresponding device which includes a BAW resonator 12, acoustic mirror 13, heater 14 and temperature sensor 15. The reference device 11 is covered by a cap (not shown) without sealing. The cap (not shown) prevents particles falling onto the sensing surface (not shown) of the reference device 11 while allowing the reference device 11 to be exposed to the ambient conditions, i.e. temperature and humidity.

The sensor 6 and reference device 11 are connected to on-chip interface circuitry 16.

The system 1 includes integrated CMOS drive circuitry for the heaters 9, 14, driving the heater 14 using, for example, pulse width modulation, constant voltage or current drive. Readout circuitry (not shown) for the temperature sensor, for example, using constant current source can be included. A temperature control circuit (not shown) may be integrated using the temperature sensor in a closed control loop, ramp or pre-set cycles. Temperature may be modulated to enhance the performance (e.g. sensitivity) of the BAW resonator 7. Control and drive circuitry for the heater and temperature sensor are not shown.

The interface circuitry 16 comprises complementary metal-oxide-semiconductor (CMOS) transistors 17, 18 and other CMOS-related structures 19 (such as interconnects) that are fabricated using CMOS fabrication processes during a CMOS fabrication phase. As will be explained in more detail later, the acoustic mirror 8 comprises CMOS-compatible materials, such as tungsten (W) and silicon dioxide ($SiO_2$), and is formed during the CMOS fabrication phase.

Figure 2:
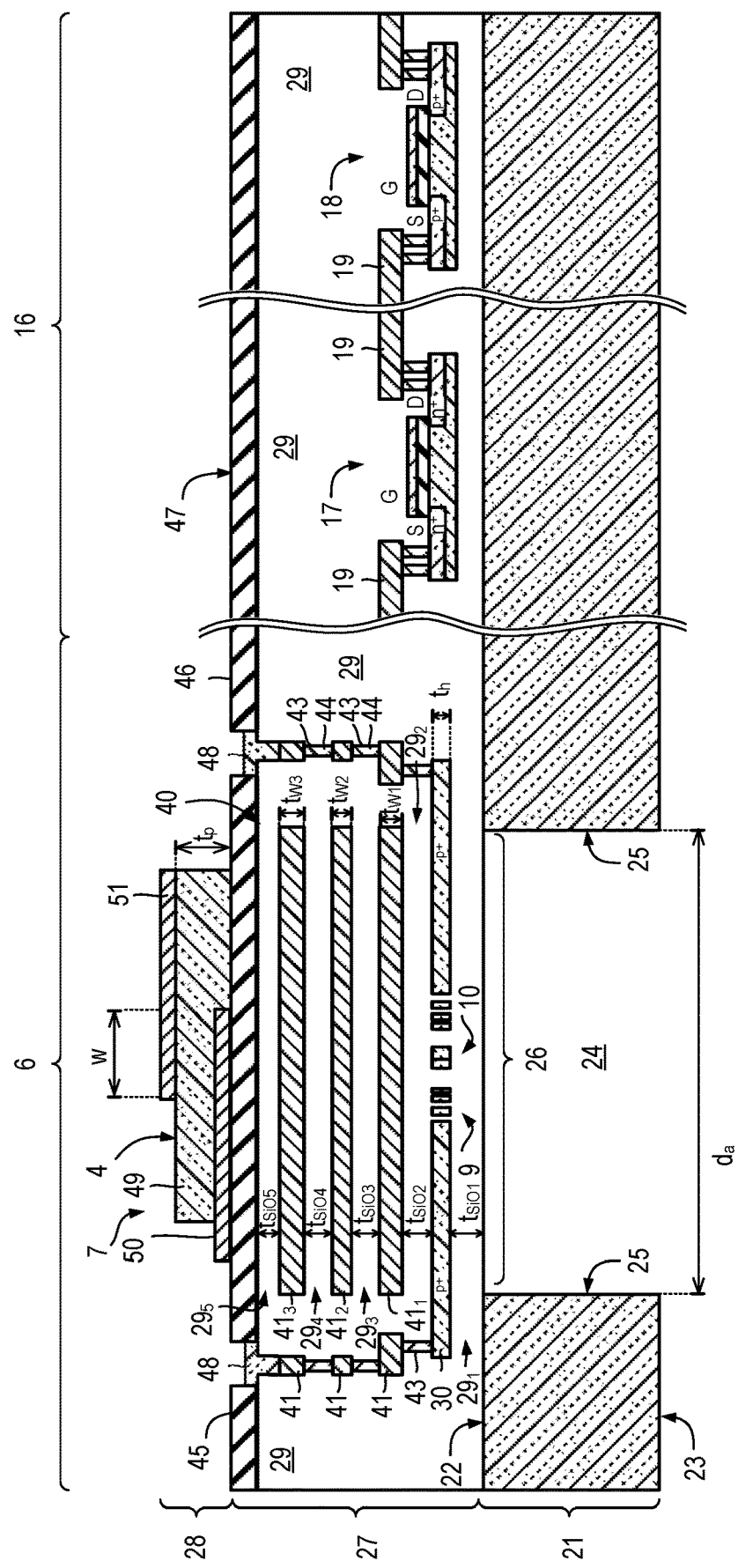
FIG. 2 is cross-sectional view of a portion of the integrated circuit shown in FIG. 1 including a substrate, CMOS process-defined layers and post-CMOS process-defined layers, the CMOS process-defined layers providing the heater, temperature sensor, acoustic mirror and interface circuitry, as and post-CMOS process defined layers providing a bulk acoustic wave resonator and an air gap is shown in FIG. 1.

Referring also to FIG. 2, the integrated circuit 2 comprises a silicon substrate 21 having a principle surface 22 (herein referred to as the "front surface") and a reverse surface 23 (herein referred to as the "back surface").

The substrate 21 may include an etched through-hole 24 (herein also referred to as an "air gap") between the front and back surfaces 22, 23 through the substrate 21, bounded by side walls 25, which defines a membrane region 26 in overlying layers 27, 28. The air gap 24 has a diameter, $d_a$, of 600 μm.

The integrated circuit 2 generally consists of layers 27 defined by standard CMOS fabrication processes ("CMOS process-defined layers") and layers 28 defined by post-CMOS fabrication processes ("post CMOS process-defined layers").

The CMOS transistors 17, 18 are formed in the CMOS process-defined layers 27 in the interface circuitry portion 16 of the integrated circuit 16. The acoustic mirror 8, heater 9 and temperature sensor 10 are also formed in the CMOS process-defined layers 27.

The CMOS process-defined layers 27 include a plurality of layers 29 of silicon dioxide ($SiO_2$). In FIG. 2, the $SiO_2$ layers 29 are shown aggregated for clarity.

Figure 3:
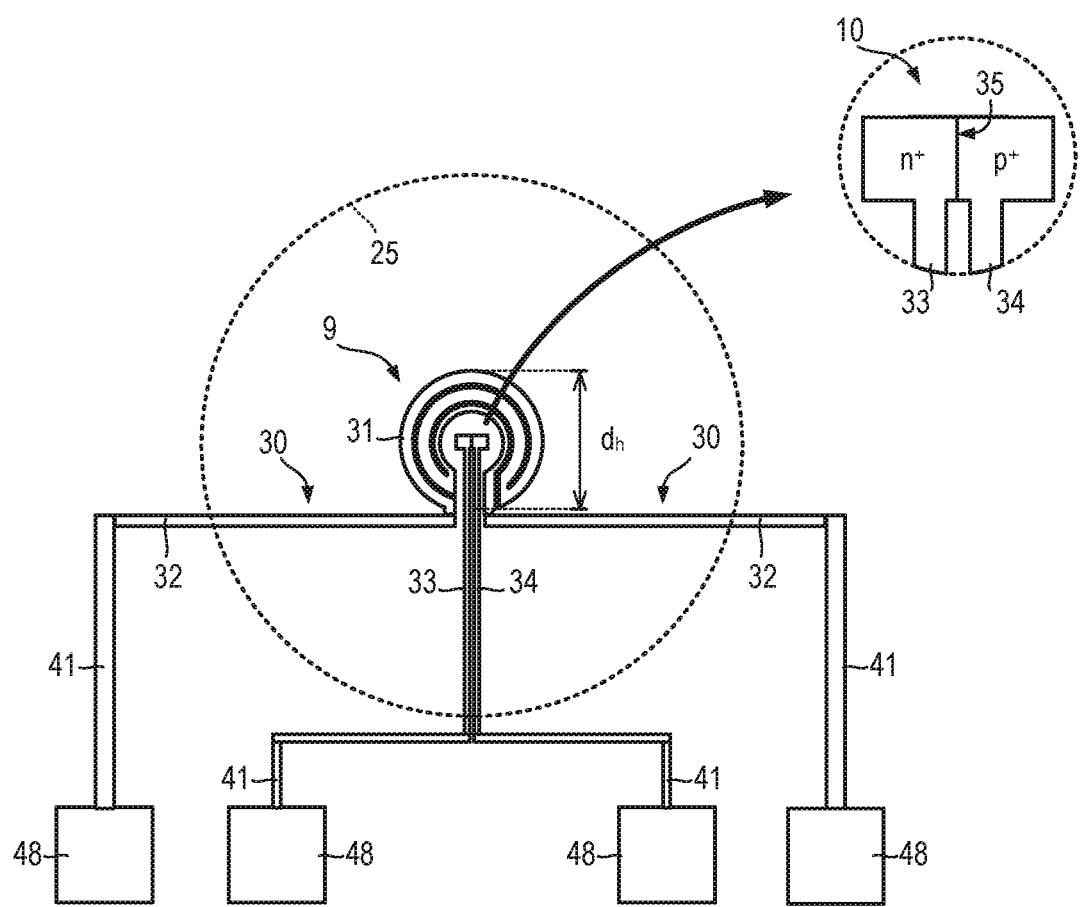
FIG. 3 is a plan view of the heater and temperature sensor shown in FIG. 2.

Referring still to FIG. 2 and also to FIG. 3, the CMOS process-defined layers 27 includes a patterned layer 30 of highly-doped p-type silicon (i.e. $p^+$ silicon). The $p^+$ silicon layer 30 lies on a $SiO_2$ layer $29_1$ having a thickness, $t_{SiO1}$, of 1 μm. The $p^+$ silicon layer 30 has a thickness, $t_h$, of 250 nm.

Referring in particular to FIG. 3, the $p^+$ silicon layer 30 includes a three-turn loop 31 which provides the heater 9. The loop 31 has a diameter, $d_h$, of 150 μm and a pair of metal tracks 32 connected to ends of the loop 31 running outwardly, in opposite, directions away from the loop 31.

The metal tracks 32 are 30 μm wide. The heater tracks are about 30 μm wide. The metal tracks 32 can have other widths, i.e. be thicker or thinner, and the heater tracks can have different angles. Narrow tracks can be used to reduce capacitance losses.

Referring to FIGS. 2 and 3, the CMOS process-defined layers 27 includes, coplanar with the heater 9, a patterned layer 33 of highly-doped n-type silicon (i.e. $n^+$ silicon) and a patterned layer 34 of highly-doped p-type silicon (i.e. $p^+$ silicon) which form an interface 35 providing the temperature sensor 10. The temperature sensor 10 lies inside the heater loop 31.

A heater element (i.e. the part of the heater 9 which predominantly provides heating) which in this case is the heater loop 31, lies near, for example, predominantly under the resonator 7 and the acoustic mirror 8. In particular, the heater 9 lies within or substantially within a lateral boundary (or "peripheral edge") of the resonator 8, i.e. the lateral edge of a patterned layer of piezoelectric material 49, and within or substantially within a lateral edge of the mirror 8, i.e. the lateral edge of a patterned layers of dielectric material $41_1$, $41_2$, $41_3$. The heater element does not extend under, for example, the transistors 17, 18 and other control circuitry. This can help to reduce heating of other parts of the system, such as the transistors, which might not need heating, and so use power delivered to the heater 8 more productively for temperature modulation of the sensor response. Thus, the heater 8 is not used to control temperature of the whole integrated circuit 2, but rather to modulate the sensor 6 so as to enhance sensor selectivity and sensitivity. Using the heater 8 can mean that the reference device 11 can be omitted.

Referring again to FIG. 2, the CMOS process-defined layers 27 includes a stack 40 of alternating metal and dielectric layers $41_1$, $29_3$, $41_2$, $29_4$, $41_3$, $29_5$ proving the acoustic mirror 8. The acoustic mirror 8 lies on a $SiO_2$ layer $29_2$ having a thickness, $t_{SiO2}$, of 1 μm.

The stack 40 includes three layers of tungsten (W) $41_1$, $41_2$, $41_3$ and three layers of $SiO_2$ $29_3$, $29_4$, $29_5$. The tungsten layers $41_1$, $41_2$, $41_3$ have respective thicknesses $t_{W1}$, $t_{W2}$, $t_{W3}$ which are equal to 300 nm, 300 and 500 nm respectively. The $SiO_2$ layers $29_3$, $29_4$, $29_5$ have respective thicknesses, $t_{SiO3}$, $t_{SiO4}$, $t_{SiO5}$ which are equal to 650 nm, 900 and 200 nm respectively.

The thicknesses of the CMOS metal layers $41_1$, $41_2$, $41_3$ and SiO$_2$ layers $29_3$, $29_4$, $29_5$ is determined by design rules of the CMOS fabrication processes available in a foundry. According to these thicknesses, a suitable thickness for the piezoelectric layer is chosen so that the acoustic mirror can effectively confine the acoustic energy of the resonator. The resonant frequency depends on the piezoelectric thin film thickness. The number of metal layers used for the acoustic mirror can be more than three. The electrode material and thickness can be chosen. Simulation and modeling using a commercially available CMOS process has been conducted for which the resonant frequency of the BAW resonator is 2 GHz.

Contact with the buried heater 9 and temperature sensor 10 is achieved through a series of vertically-stacked vias 43 which are formed in the SiO$_2$ layers 29 and filled with polysilicon 44 which interconnect with multi-level regions of tungsten 41.

An upper surface 45 of the SiO$_2$ layers 29 is covered by a silicon nitride (Si$_3$N$_4$) passivation layer 46 having an upper layer 47. The passivation layer 46 can be PECVD silicon nitride (Si$_3$N$_4$) or it can be formed from another suitable material, such as silicon dioxide (SiO$_2$). The passivation layer 46 protects the device surface against contaminants and possible damage due to post-processing, such as dicing and handling of devices. Openings through the passivation layer are used to expose the pads for connection. Metal contact pads 48 are disposed on the surface of the last silicon dioxide layer $29_5$ within a window in the passivation layer 48.

Figure 4:
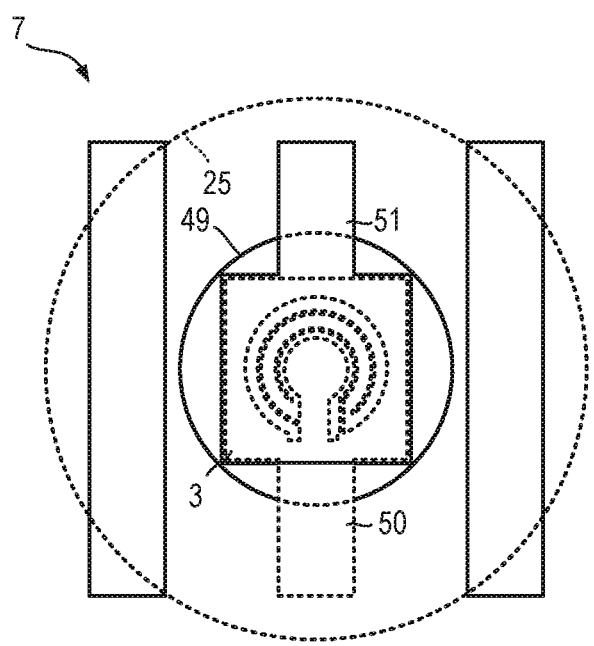
FIG. 4 is a plan view of the bulk acoustic wave resonator shown in FIG. 2.

Referring also to FIG. 4, the BAW resonator 7, which is disposed on the upper surface 47 of the passivation layer 46, comprises a layer of piezoelectric material 49 sandwiched between lower and upper electrodes 50, 51. The piezoelectric material is zinc oxide (ZnO). The piezoelectric layer 49 has a thickness, $t_p$, of 1.2 μm. The electrodes 50, 51 comprise aluminum (Al) and have thickness, $t_{Al}$, of 200 nm. The electrodes 50, 51 overlap by a width, w, of 200 μm, and define the extent of the sensing surface 3.

Interface Circuit 16

Acoustic wave perturbations induced by particle deposition present themselves as attenuation and velocity changes of the bulk wave.

Figure 5:
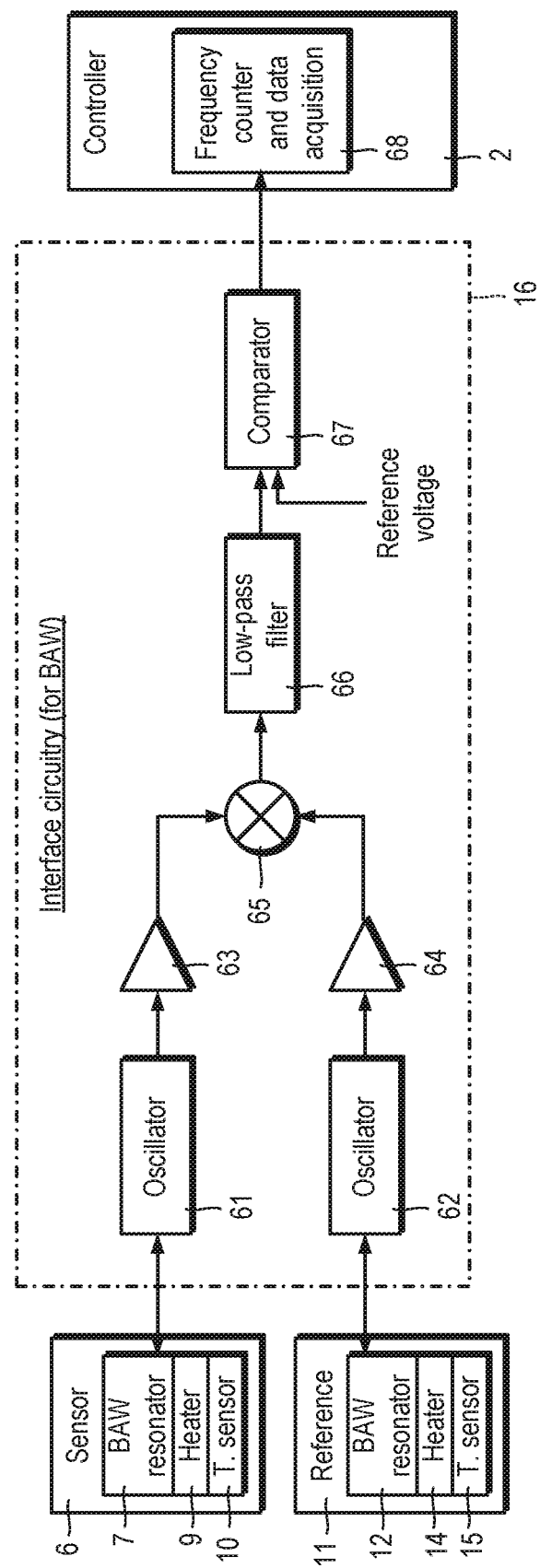
FIG. 5 is a schematic block diagram of a portion of the interface circuitry shown in FIG. 1.

Referring to FIG. 5, a portion of the interface circuitry 16 is shown. The first portion of the circuitry is used to down convert high frequency signals (e.g. around 1 GHz) to lower frequency signals (e.g. around 10 MHz) and generate a square wave signal for processing by the processor 2.

Fabrication of the BAW device 6 and interface circuitry 16 on the same chip 2 is possible due to the use of CMOS processes for implementing of the acoustic mirror 8 and circuitry 18 using CMOS materials and CMOS compatible materials.

The interface circuitry 16 for the BAW devices 6, 11 may be an analogue, phase- or frequency-based measurement system. For a frequency measurement system, an oscillator circuit for driving the BAW devices 6, 11 may include a simple RF amplifier or a more complex circuit, such as a Colpitts or Pierce oscillator 61, 62, implemented with CMOS inverters. Each of the oscillator signals are amplified using, for example, a CMOS inverter amplifier 63, 64. These signals can be fed to the analogue mixer 65 and a low-pass filter 66 which provides a differential output sent to a comparator 67. The frequency of the output signal of the comparator 67 can be externally measured by using a frequency counter 68 provided by a microcontroller or data acquisition board. Digital circuitry (not shown) could be also be integrated in the CMOS chip for the signal processing.

An example of the oscillator circuit is a Pierce type oscillator in which a cascade of three CMOS inverter amplifiers are implemented by MOSFETs for the gain stage.

Fabrication

Figure 6:
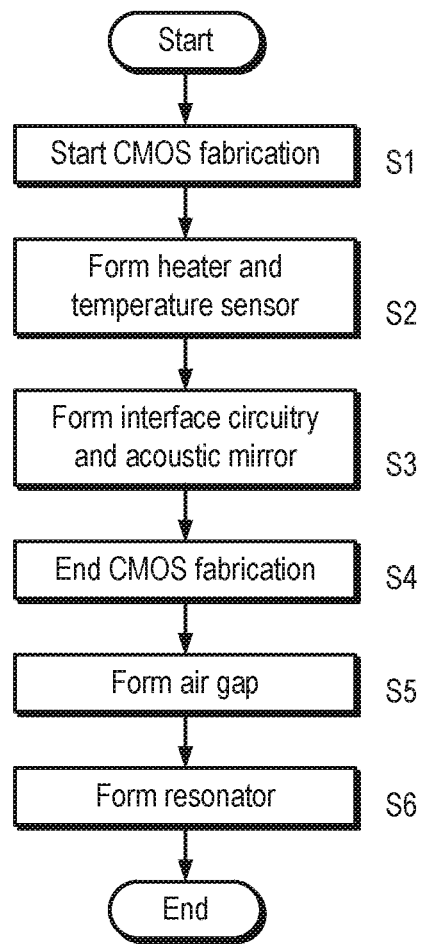
FIG. 6 is a process flow diagram of a method of fabricating the integrated circuit.

Referring to FIGS. 2 and 6, a method of fabricating the integrated circuit/device will now be described.

Starting with a silicon wafer (not shown), CMOS device fabrication starts (step S1).

Fabrication comprising a succession fabrication stages during which the heater 9 and temperature sensor 10 are formed (step S2) and the interface circuitry 16 and acoustic mirror 8 are formed (step S3).

Each stage may include depositing one or more layers (not shown), patterning one or more layers (not shown) using photolithography, etching one or more layers (not shown) and/or implanting dopants in one or more layers (not shown).

Several stages may be needed to define a structure, such as an acoustic mirror 8, a heater 9, a temperature sensor 10 or CMOS circuit element 17, 18, 19. One or more stages may be commonly used when defining two different structures. For example, the same stage may be used to define interconnect 19 and a tungsten layer 41.

After the final CMOS device fabrication has finished (step S4), post-CMOS processing is performed during which the air gap 23 is formed (step S5) and the resonator 7 are formed (step S6).

The membrane 26 is circular (in plan view) and is formed by back etching the silicon substrate 21. This can be done by isotropic or anisotropic etching, for example, using KOH or deep reactive ion etching (DRIE).

The bottom electrode 50 is formed by depositing and patterning a bottom electrode material, for example aluminum, gold or other suitable metal or other conductive material, by sputtering or evaporation.

A piezoelectric thin film 49 is deposited and patterned on top of the bottom electrode and the top electrode 51 is formed on the piezoelectric material by depositing and pattering the metal.

Operation

Referring to FIGS. 1 to 5, a method of operating the integrated circuit/device 2 will now be described.

The system operates in a dual-mode configuration in which a first BAW device 6 is used as a sensing device for the suppression of common mode interferences, such as pressure, temperature and humidity and a second BAW device 11 is used as a reference.

The BAW devices 6, 11 connected to the CMOS oscillators 61, 62 and interface circuitry are connected to a power supply (not shown).

A current drive is supplied to the heaters 9, 14 of the sensing and reference devices 6, 11 to control the temperature. A signal from a temperature sensor 10, 11 can be used to control the actual sensor temperature. The temperature may be modulated in order to enhance performance, such as to improve sensitivity.

The output oscillating signal of the sensors are mixed and filtered obtaining a lower differential frequency output that can be measured at high resolution. The differential signal is input to a comparator 67 and the frequency of the square signal is measured using a microcontroller or frequency counter 68.

The total mass of the particles 4 or analyte deposited onto the active area 3 of the sensing device produces a change in the resonant frequency of the first BAW device 6. This frequency shift can be related to the total mass of particles or gas concentration.

The sensor surface 3 may need to be cleaned from time to time in order to avoid loss of signal quality due to saturation. The heater temperature may be raised to a high temperature, for example equal to or greater than 100° C., to drive off particles 4 on the surface 3 and so to extend the life of the device.

Modifications

It will be appreciated that various modifications may be made to the embodiments hereinbefore described. Such modifications may involve equivalent and other features which are already known in the design, manufacture and use of bulk acoustic resonators, microelectromechanical systems (MEMS), particle sensors and gas sensors and component parts thereof and which may be used instead of or in addition to features already described herein. Features of one embodiment may be replaced or supplemented by features of another embodiment.

The metal layers $41_1$, $41_2$, $41_3$ of the acoustic mirror 8, 13 can be formed of CMOS materials, such as tungsten, aluminum or titanium, or CMOS-compatible materials, such as titanium nitride or tungsten nitride.

The geometry or shape of the heater area can differ and can be, for example, circular or rectangular, serpentine, spiral, comb-shaped or formed by concentric rings.

The heater 9, 14 can be made of polysilicon, single-crystal silicon, CMOS metals, such as aluminum, tungsten or titanium, or CMOS compatible materials such as titanium nitride.

The sensor and reference heating elements may include a heat spreading plate made of polysilicon single crystal or metal in order to enhance temperature distribution.

The temperature sensor 10, 15 can be a silicon on insulator diode or a resistor made CMOS metals, CMOS compatible metals, single crystal silicon or polysilicon.

The membrane 26 can have a variety of shapes, such as circular or rectangular. Circular or rounded corners are preferred to reduce mechanical stress.

Although claims have been formulated in this application to particular combinations of features, it should be understood that the scope of the disclosure of the present invention also includes any novel features or any novel combination of features disclosed herein either explicitly or implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

The invention claimed is:

1. A system comprising
a device that includes:
a silicon substrate;
a sensor comprising:
a first bulk acoustic wave resonator; and
a first acoustic mirror disposed between the bulk acoustic wave resonator and the substrate;
a heater disposed between the first acoustic mirror and the substrate;
a CMOS circuit supported by the substrate and operatively connected to the sensor; and
a controller operatively connected to the device and configured to receive signals from the device and/or to provide control signals to the device, the controller arranged to cause heating of the heater to greater than 100° C.

2. A system according to claim 1, wherein the device comprises:
CMOS process-defined layers,
wherein the CMOS process-defined layers include the acoustic mirror.

3. A system according to claim 1, wherein the heater comprises a loop of conductive material.

4. A system according to claim 1, wherein the device further comprises:
a temperature sensor disposed between the acoustic mirror and the substrate.

5. A system according to claim 1, wherein the device further comprises:
a reference sensor comprising:
a second bulk acoustic wave resonator; and
a second acoustic mirror disposed between the bulk acoustic wave resonator and the substrate.

6. A system according to claim 1, wherein the silicon substrate includes a hole through the substrate so as to cause the sensor to be suspended over the hole.

7. A system according to claim 1, wherein the device is a sensor.

8. A system according to claim 1, wherein the device is a gas and/or particle(s) sensor.

9. A system according to claim 1, wherein the device is an integrated circuit.

10. A system according to claim 1, wherein the device is an integrated device.

11. A method of operating the system according to claim 1, the method comprising:
the CMOS circuit driving the sensor and measuring signals from the sensor.

12. A method according to claim 11, wherein the device comprises a heater and wherein the method further comprises:
modulating current through the heater so as to modulate temperature of the sensor.

13. A method of fabricating the system according to claim 1, the method comprising:
fabricating CMOS-compatible structures using CMOS-compatible materials during a CMOS fabrication phase on a silicon substrate; and
fabricating non-CMOS structures using non-CMOS-compatible materials during a post CMOS fabrication phase after the CMOS fabrication phase;
wherein fabricating the CMOS-compatible structures includes fabricating the acoustic mirror and the CMOS circuit, wherein fabricating the non-CMOS-compatible structures includes fabricating the bulk acoustic wave resonator.

14. The method of claim 13, wherein fabricating the non-CMOS-compatible structures includes fabricating an air gap in the substrate to form a membrane, the bulk acoustic wave resonator being disposed on the membrane.

15. The method of claim 13, wherein fabricating the CMOS-compatible structures includes fabricating a heater disposed between the acoustic mirror and the substrate.

16. The method of claim 15, wherein the heater comprises a loop of conductive material.

17. The method of claim 13, wherein fabricating the CMOS-compatible structures includes fabricating a temperature sensor disposed between the acoustic mirror and the substrate.

* * * * *